United States Patent [19]

Hannah et al.

[11] Patent Number: 6,018,447
[45] Date of Patent: Jan. 25, 2000

[54] METHOD AND APPARATUS FOR REDUCING GROUND FAULT RISKS IN CABLED SIGNAL LINES

[75] Inventors: Eric C. Hannah, Pebble Beach, Calif.; Michael A. Brown, Phoenix, Ariz.

[73] Assignee: Intel Corporation, Santa Clara, Calif.

[21] Appl. No.: 08/975,627

[22] Filed: Nov. 21, 1997

[51] Int. Cl.$^7$ ........................................ H02H 3/00
[52] U.S. Cl. .............................. 361/42; 361/103; 361/115
[58] Field of Search ................. 361/42, 115, 56, 361/91, 111, 113, 93, 58, 103

[56] References Cited

U.S. PATENT DOCUMENTS 3,697,808  10/1972  Lee ............................................ 361/42
4,950,169  8/1990  Martin et al. ............................. 439/44
5,170,318  12/1992  Catala et al. ............................ 361/323

*Primary Examiner*—Stephen W. Jackson
*Attorney, Agent, or Firm*—Blakely, Sokoloff, Taylor & Zafman LLP

[57] ABSTRACT

A method and apparatus for protecting a system from high current flows in its signal lines. A signal line expected to carry radio frequency signal is provided. A thin region is disposed in series with the signal line. The thin region is destroyed in the presence of current above a safety level. Additionally, the thin region is designed to maintain the impedance profile of the signal path at an approximately constant RF impedance or else the impedance discontinuity caused by the thin region is sufficiently narrow such that it falls within an exception window.

14 Claims, 2 Drawing Sheets

METHOD AND APPARATUS FOR REDUCING GROUND FAULT RISKS IN CABLED SIGNAL LINES

BACKGROUND OF THE INVENTION

1. Field of the Invention

The invention relates to protection from high current flows. More specifically, the invention relates to ground fault protection in cabled signal lines.

2. Related Art

Alternating Current (AC) powered systems are typically electrically wired such that the hot wire and a neutral wire go to a device physically contained within a metal housing. A third wire, the green wire couples to the metal housing, which in turn is coupled to a local ground. Under normal operating conditions, the green wire does not carry current to or from the device. The neutral wire is also connected to local ground but must carry the full current used by the powered device. The neutral wire will exhibit significant voltages due to a current-resistance (IR) drop across the neutral wire. Without the green wire, if the hot wire shorts to the metal housing an electrocution hazard would exist. With the green wire, in the event of a hot wire short to the metal housing large amounts of current will flow through the green wire to ground opening a fuse or circuit breaker in the hot wire circuit.

A consequence of the green wire protection is that the powered device will float its metal housing to the local ground voltage level. However, local grounds can vary by many volts in potential due to nearby equipment returning large currents to earth through their neutral wires, or due to lightning, or due to being in different AC power environments (e.g., between houses the AC power can come from different pole transformers). Electronic equipment makers assume that all powered devices that connect with their equipment have exactly the same green wire environment. This assumption though reasonable is frequently incorrect. Medical, telecommunications, and industrial equipment makers must also deal with the regulations requiring them to limit the chassis-to-chassis current that can flow.

Certain long distance signaling techniques exacerbate the problems and risks created when the above assumption is incorrect. One such technique is serial data transfer using the IEEE Standard for a High Performance Serial Bus, IEEE Std. 1394-1995, published Aug. 30, 1996 (1394-1995). Systems of the genre implementing 1394-1995 or any subsequent update of that standard will be generically referred to herein as 1394 systems. Similarly, 1394 protocol will be used to generically refer to the protocol of 1394-1995 and its subsequent revisions. The high speed serial communications provided for by 1394 protocol is an important input/output (I/O) capability for personal computers (PC's) and consumer electronics peripherals.

A 1394 protocol is a bit serial protocol which uses metal cables to communicate at hundreds of megabits per second. The protocol is defined to permit four and a half meter hops with up to sixteen hops through repeaters permitted. The effect is that distances of 50 meters or more between devices can be expected. Prior experiences with local area networks (LANs) identified that long distance metal connections increase the probability of different ground potentials which can lead to high current flows resulting in melted cables and possible fire. Thus, a liability issue arises by virtue of the use of long distance metal cabling in 1394 systems.

In the 1394 systems the source of the problem is threefold. First, a possible problem is the power lines. The power lines carry power from some external power supply, and that power supply is usually tied to the green wire local ground at its location. Thus, if there is a vastly different local ground potential between the power supply and a supplied device, the power lines may carry a large current independent of the power being supplied.

The second problem is the signal lines themselves. The 1394 cable typically contains two differential pairs of signal lines which are small gauge and carry high frequency signals to silicon transceivers at either end. The silicon transceivers, of course, are powered and have a ground reference. If either of the transceivers is not supplied by an isolated power supply or if either of the transceivers is intimately or directly connected to the logic ground of the remainder of the circuit, then a sneak path to local ground exists through the signal wires. If the local ground potential between the transceivers is sufficiently different, high current will flow in the signal wires, destroying the transceivers and resulting in a highly conductive path, cable melting and possible fire.

The third problem is that 1394 systems require high speed signaling coming from a noisy environment. Accordingly, to avoid picking up external radiation from transmitters and to meet Federal Communication Commission (FCC) admissions guidelines, metal shielding must be provided around the cable. The metal shields are connected to the chassis at either end of the cable. Inasmuch as the metal shields conduct and the chassis may have different ground potentials, a shield melt-down may result.

Each of these problems has long been identified and 1394-1995 has a proposed solution for each. However, as discussed below, economic and technical impediments to the implementation of these proposed solutions makes wide spread adoption unlikely. Moreover, because of requirements imposed by the protocol on good citizens, implementation by some devices in the network but not all will not insulate the implementer from potential liability. For example, a printer manufacturer may implement all possible costly procedures yet still find its printer in a mass of melted cables making innocence difficult to prove.

With respect to the power supply, 1394-1995 requires that manufacturers isolate the power supply. This implies transformers with separate windings and a separate ground plane such that the ground of the transformer is not tied to the green wire local ground. Unfortunately, these special steps are quite expensive, so as a practical matter, cheap devices will not isolate the power supply and rather they will continue to tie to the local ground. That being the case, it does not matter what steps other devices in the network have taken in terms of isolation; since at least one device in the network did not properly isolate, a melt down risk exists. This is particularly true since the guidelines require that all multi-port devices pass through power. Therefore, the quality device (such as the printer in the example above), having taken all the requisite steps to isolate its power supply and even if not supplying power itself, is required to pass through the power supplied by an unisolated device.

With respect to the signal wires, 1394-1995 requires that the transceiver for the device be isolated. This requires capacitive or transformer blocking to be placed between the transceiver data path and its controlling link. This transceiver isolation is consistent with what is done with ethernet. Unfortunately, this isolation of the transceiver currently carries an incremental cost which may be $5.00 or higher. Whereas, with current processing technology, the transceiver can be integrated onto a single chip with the device at very low cost. Accordingly, economic considerations will ultimately drive device manufacturers to integrate and isolation will be lost.

With respect to shielding, 1394-1995 proposes that the shield not be tied to the bulkhead, chassis, or Faraday cage (generically metal housing) of the device directly but rather be tied to the metal housing through a capacitor with a one megaohm resistor. The resistor bleeds off static electricity and the capacitor is chosen to block 60 Hz power signals but permit the high frequency signals to be passed. Unfortunately, using a single capacitor results in series inductance in the long leads which does not result in a good radio frequency (RF) ground. Moreover, because all the current from the 360° around the shield is routed through a single channel at the capacitor, a slot antenna is created which acts as a radiator in violation of FCC guidelines. Thus, this fix is not commercially viable.

For economics and feasibility reasons, these solutions are not suitable for future generations of 1394 systems. The net result of the foregoing is that subsequent editions of the 1394 Standard specifically, P1394 a Draft Standard for a High Performance Serial Bus (1394a) and P1394 b Draft Standard for a High Performance Serial Bus (1394b) have eliminated all isolation and ground fault protection requirements. But because of the potential liability these problems represent, unless a commercially viable resolution can be found many manufacturers will be hesitant to assume the risks of supporting 1394 protocol. Accordingly, it would be desirable to develop a method and apparatus to limit the risk of catastrophic failure resulting in possible fire, shock hazard, and potentially high liability.

BRIEF SUMMARY OF THE INVENTION

A method and apparatus for protecting a system from high current flows in its signal lines is disclosed. A signal line expected to carry radio frequency signal is provided. A thin region is disposed in series with the signal line. The thin region is destroyed in the presence of current above a safety level. Additionally, the thin region is designed to maintain the impedance profile of the signal path at an approximately constant RF impedance or else the impedance discontinuity caused by the thin region is sufficiently narrow such that it falls within an exception window.

DETAILED DESCRIPTION OF THE INVENTION

Figure 1:
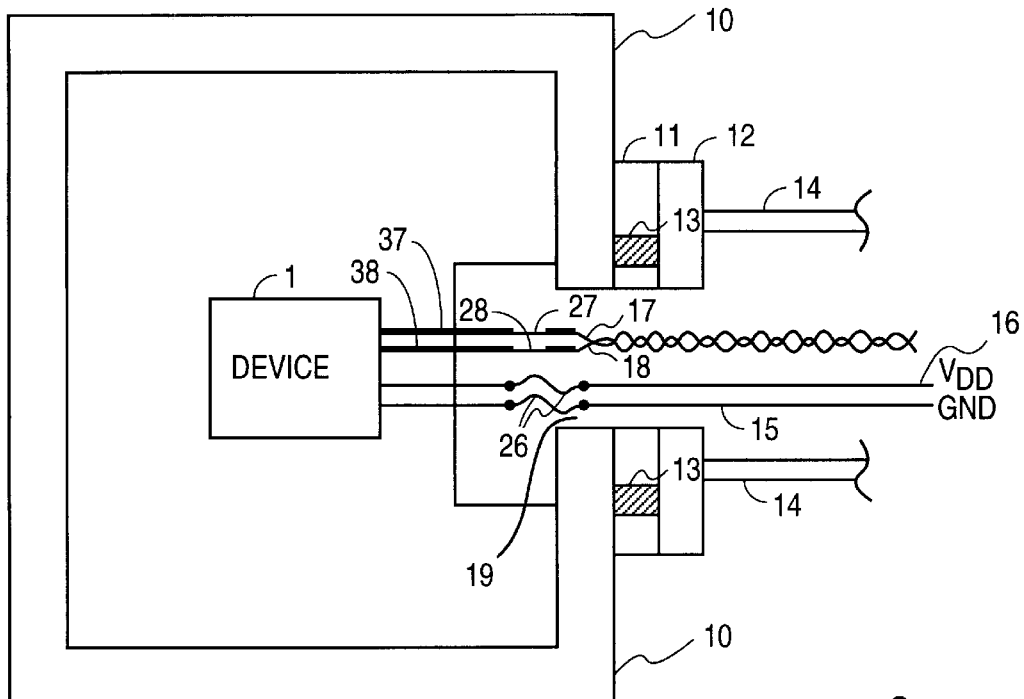
FIG. 1 is a cross-sectional and block diagrammatic view of one embodiment of the invention.

FIG. 1 is a cross-sectional and block diagrammatic view of one embodiment of the invention. The device 1 is enclosed in a metal housing 10. A plurality of external signal lines 17, 18 provide a differential signal path between device 1 and a device (not shown) external to the metal housing 10. Hot power line 16 carries a power signal from an external source (not shown) neutral power line 15 that may be coupled to a local earth ground of the external source. The power lines 15, 16 and the signal lines 17, 18 are shielded by a metal shield 14 that surrounds the power and signal lines for substantially their entire length outside the housing. The shield, power and signal lines are cabled together. The cable terminates in a plug (not shown) which may be inserted into a receptacle coupled to the housing 10. When the cable is plugged in to the receptacle, the external signal lines 17, 18 and power lines 15, 16 are in electrical communication with the device 1 via corresponding lead lines within the housing. The connector receptacle includes a conductive plate 12 and capacitor gasket comprising a non-conductive plate 11 coupled adjacent thereto. Non-conductive plate 11 defines a plurality of component wells 13 in which components may reside so as to have a first terminal coupled to the conductive plate and a second terminal coupled to the housing 10. When capacitors are disposed within the component well 13, the shield 14 is capacitivly coupled to the housing 10. The housing 10 in turn is deemed to be coupled to local ground. Further description of the capacitive coupling is found below in connection with FIG. 3.

A through hole 19 is defined by the conductive plate 12, the non-conductive plate 11, and the housing 10 such that the power lines 15, 16 and signal lines 17, 18 are not in the electrical contact with the housing 10. Various physical interconnections between the cable pins and the receptacle contacts are well known in the art. In one embodiment, power lines 15 and 16 are each provided with a fuse 26. Fuse 26 may be a standard slow-blowing fuse which blows at approximately 1.5 amps. Standard fusing is acceptable for the power lines because the expected signals on the power lines are approximately DC with a little ripple. Therefore, the poor high frequency response of the standard fusing is of little importance. Conversely, such conventional fusing would be totally unacceptable for the signal lines which should preserve RF impedances within a certain range and burn out quickly enough to protect the systems cables from melting. In one embodiment, it is preferred to preserve the RF impedance to within ±20 ohms of the signal line impedance. In another embodiment, a greater impedance discontinuity is permitted but only to the extent that signals in the expected frequency range can pass the discontinuity within a predefined exception window. One such exception window might be 100 picoseconds. Internal contacts of the receptacle are each provided with a thin region 27 and 28. The internal contacts are in series with internal signal lines going to the device. Accordingly, the external signal lines 17, 18 contact with the internal thin portions 27, 28 and the internal signal lines 37, 38 form a continuous signal path from an external device to device 1. As used herein the thin region is defined to be a region which maintains RF impedance but will melt and be destroyed in the presence of a current greater than the predetermined value, the predetermined value being below a level expected to cause cable meltdown. To maintain the RF impedance, the inductance and capacitance should be approximately the same per unit length as in the signal line. Examples of a thin region include physically thinning the signal line, providing a different material having a lower melting point and an etched region which forms a two dimensional mesh. Other examples will occur to one of ordinary skill and are within the scope and contemplation of the invention. In one embodiment, the thin region is destroyed in the presence of approximately one amp.

While in FIG. 1 only a single differential pair is shown, typically a 1394 cable contains two differential pairs of signal lines; accordingly, four thin regions would be used in connection with a typical 1394 cable. Use of the thin portions to protect an arbitrarily large number of signal lines is within the scope and contemplation of the invention. It is also within the scope and contemplation of the invention to have the power line fusing, thin portions and capacitor gasket as part of the plug on the cable rather than as part of the receptacle. However, from a device manufacturer's perspective, it is preferred for liability reasons to have these safety features in the receptacle because then the manufacturer has control over its installation. Whereas, if these protective mechanisms are only part of the cable, a user may opt to use a less expensive/less safe cable with a corresponding liability risk for the device manufacturer.

Figure 2:
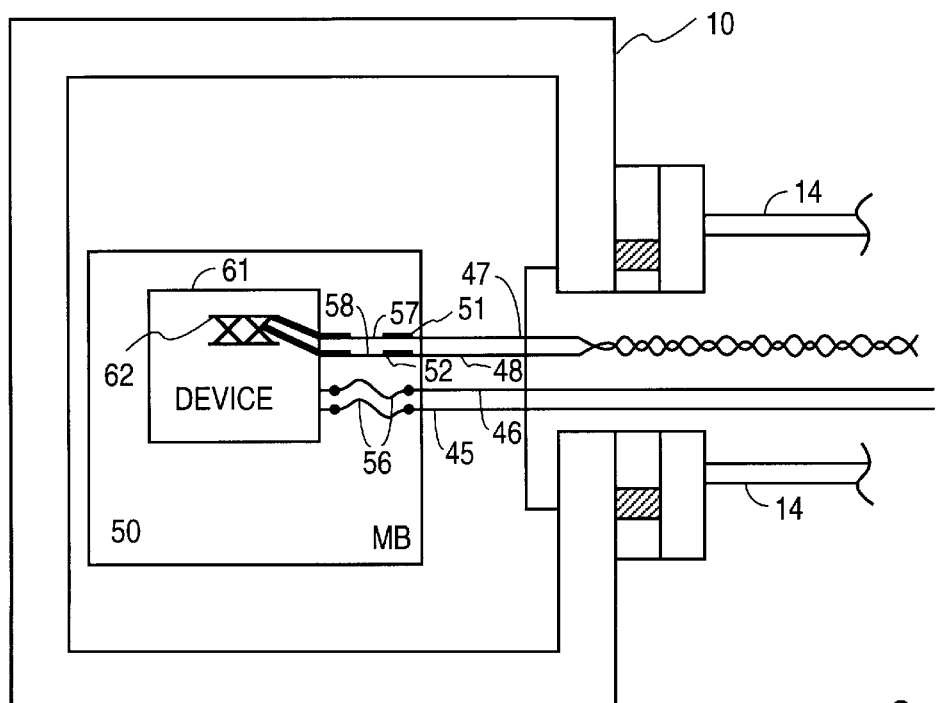
FIG. 2 is a cross-sectional block diagrammatic view of an alternative embodiment of the invention.

FIG. 2 is a cross-sectional block diagrammatic view of an alternative embodiment of the invention. The shield is coupled to the housing 10 as in the embodiment of FIG. 1. However, within the housing, device 61 is disposed on a motherboard 50. A transceiver 62 is part of device 61. Internal signal lines 47, 48 convey a differential signal to motherboard traces 51, 52. The motherboard traces 51, 52 are each provided with a thin region 57, 58 between the internal signal lines 47 and 48 and the transceiver 62 of device 61. The thin region is designed to melt in the presence of a current exceeding a safety current level. In one embodiment, the safety current level is defined to be approximately one amp. Motherboard 50 also has coupled thereto fuses 56 in series with internal power lines 45 and 46. The fuses 56 may be standard slow-blowing fuses. In one embodiment, the fuses are designed to blow at 1.5 amps.

It should be recognized by one of ordinary skill in the art that all combinations of distributing thin portions and the fuses between the motherboard and/or the connector receptacle are within the scope and contemplation of the invention. Thus, embodiments including the fuses on the motherboard and the thin portions within the connector receptacle or vice versa are deemed to be consistent with the scope of the invention. Moreover, a typical 1394 system includes differential pairs of signal lines. In such cases, each signal path will be provided with a thin region.

Figure 3:
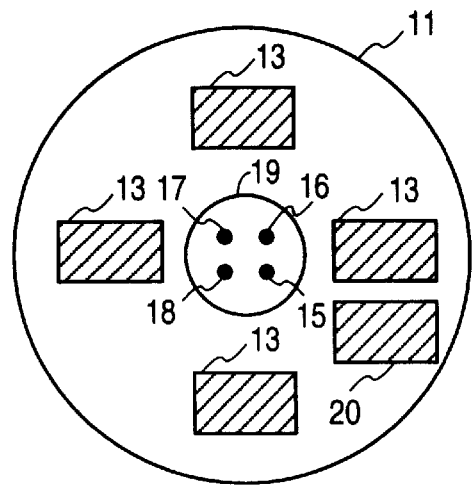
FIG. 3 is a plan view of the capacitor gasket.

FIG. 3 is a plan view of the capacitor gasket. Non-conductive plate 11 defines a plurality of component wells 13 which are symmetrically spaced around the through hole 19 and component well 20 which need not adhere to the symmetry of component wells 13. In one embodiment, each of component wells 13 contains a capacitor chip. The capacitor chip is chosen to be physically small, high quality with low inductance. Because the capacitors are coupled directly between the conductive plate and the metal housing, inductance is further reduced over prior art solutions in which long leads coupled a single capacitor between the housing and the shield. Moreover, by using several evenly distributed capacitors around the through hole, the current is spread out so no slot antenna is created. In one embodiment four symmetrically arranged component wells 13 each hold a capacitor. In another embodiment, six or eight component wells 13 are symmetrically arranged around the through hole and each containing a capacitor. Different numbers of component wells containing capacitors are within the scope and contemplation of the invention.

Component well 20 need not be symmetrically arranged, may contain one or both of a resistor, which bleeds off static discharge, and a spark gap, which provides an arc path, thereby protecting the high quality capacitors from destruction due to static arcing. It is also within the scope and contemplation of the invention that the resistor and spark gap may be included in one of the component wells 13 with a capacitor. Alternatively, a second asymmetric component well 20 may be established such that the resistor is as in one component well 20 and the spark gap resides in a second component well 20. It is also within the scope and contemplation of the invention to provide more than a single resistor and/or spark gap. However, one has been found sufficient to provide the RF integrity required of the shield.

Figure 4:
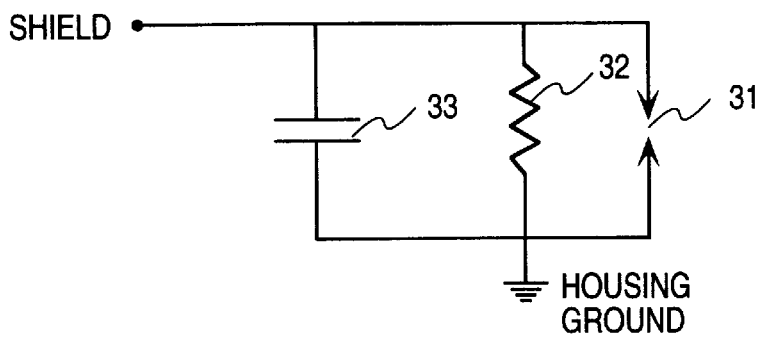
FIG. 4 is a schematic of the circuit created by the capacitor gasket of one embodiment of the invention.

FIG. 4 is a schematic of the circuit created by the capacitor gasket of one embodiment of the invention. The shield is connected to the housing ground via capacitor 33 in parallel with resistor 32 in parallel with spark gap 31. In this schematic, capacitor 33 represents the parallel capacitance of the capacitors in each of the component wells 13.

Figure 5:
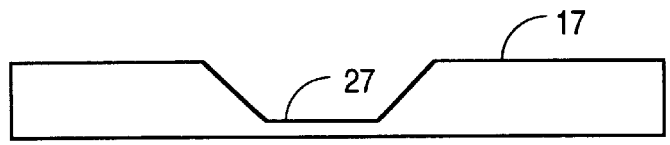
FIG. 5 is a side view of the thin regions of the differential signaling path of one embodiment of the invention.
Figure 5:
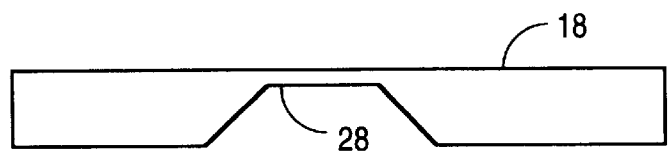
Figure 6:
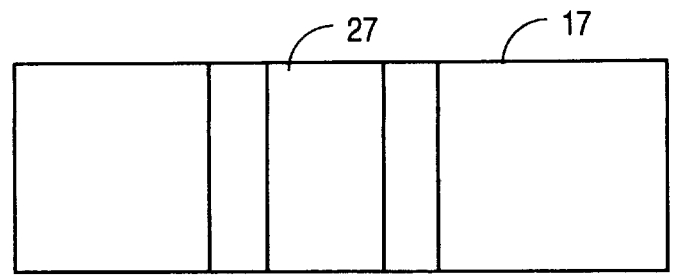
FIG. 6 is a top view of the thin region of signal line.

FIG. 5 is a side view of the thin regions of the differential signaling path of one embodiment of the invention. The thin region may be formed by, for example, etching away the internal lead in the receptacle so that it is sufficiently thin so as to be destroyed in the presence of excessive current. In one embodiment, current is deemed excessive at approximately one amp. However, it is important that the thinned regions pass signals of frequencies up to one gigahertz. To that end it is preferred that the signal lines as a whole and the thinned portions in particular have highly controlled impedances otherwise the ringing in the signal line will cause data transmission errors. It is also desirable that the thin portion be relatively narrow so that even if an impedance discontinuity exists, signals on the line will pass the discontinuity within an exception window. In one embodiment of 1394, signaling the exception window is defined to be 100 picoseconds. By thinning the metal of the signal line, the RF impedance to ordinary signals may look fine but a catastrophic discharge (in one embodiment anything greater than approximately one amp) will melt the thinned region creating an open circuit and preventing cable melting and possible fire due to ground faults in the signal line. As noted above, one of ordinary skill should recognize that there are many ways that a controlled impedance melt susceptible "thin region" can be created. All such ways are within the scope and contemplation of the invention. FIG. 6 is a top view of the thin region 27 of signal line 17.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
    a capacitor gasket defining a through hole;
    a conductive plate coupled adjacent to the capacitor gasket and in electrical contact with a plurality of capacitors of the capacitor gasket; and
    a pair of conductive contacts each having a thin region, the conductive contacts to be coupled to a differential pair of signal lines.

2. The apparatus of claim 1 wherein each of the thin regions has a radio frequency (RF) impedance approximately the same as a corresponding signal line.

3. The apparatus of claim 1 further comprising a first fuse and a second fuse disposed within the apparatus so as to be coupled in series with an internal hot power line and an internal neutral power line, respectively.

4. The apparatus of claim 1 wherein a signal passes the thin portion at expected frequencies within an exception window.

5. The apparatus of claim 4 wherein the exception window is less than or equal to approximately 100 picoseconds.

6. The apparatus of claim 1 wherein the capacitor gasket comprises:

an insulative plate, the insulative plate defining a plurality of component wells; and a capacitor disposed within each of a subset of the component wells so as to have one terminal in electrical contact with the conductive plate.

7. The apparatus of claim 6 wherein a subset of the plurality of the component wells containing capacitors are approximately symmetrically distributed around the through hole.

8. The apparatus of claim 7 wherein the capacitor gasket further comprises:

a resistor disposed within a component well so as to have one terminal in electric contact with the conductive plate; and a spark gap disposed within a component well so as to have one terminal in electric contact with the conductive plate.

9. A method comprising:

providing an electrically conductive contacts between a signal line and a device, the contact having a thin region, the thin region destroyed in the presence of current exceeding a predetermined level, the predetermined level being below a level at which a cable carrying the signal line will melt; and capacitivly coupling a shield of the signal line to a local ground.

10. The method of claim 9 further comprising:

bleeding off static charge from the shield; and providing an arc path to protect a capacitor used in the capacitive coupling from static discharge.

11. The method of claim 9 further comprising:

fusing an incoming power line between a power cable and the device.

12. The method of claim 9 wherein the step of capacitivly coupling comprises:

coupling the shield to a conductive plate such that contact is maintained between the shield and the plate for substantially 360°;

coupling a non-conductive plate having a plurality of symmetrically arranged component wells formed therein to the conductive plate, the symmetrically arranged component wells each containing a capacitor, a first lead of which is in electrical communication with the conductive plate once the plates are coupled together; and abutting the non-conductive plate against a metal housing of a device such that a second lead of each capacitor is in electrical contact with the metal housing wherein the metal housing of the device is coupled to local ground.

13. An apparatus comprising:

a signal line that carries radio frequency (RF) signals; and a thin region in series with the signal line, the thin region destroyed in the presence of current on the signal line above a predetermined safety level, wherein the signal line and the thin region have one of an approximately constant RF impedance profile and an impedance discontinuity falling within an exception window.

14. An apparatus comprising:

a housing; and means for protecting a high frequency signaling wire from ground faults, the means including a thin region electrically contiguous with the high frequency signaling wire wherein the thin region is destroyed in the presence of a current exceeding a predetermined level, the predetermined level being below a level at which the signaling wire will melt.

* * * * *